(12) United States Patent
Lai

(10) Patent No.: US 7,187,199 B1
(45) Date of Patent: Mar. 6, 2007

(54) STRUCTURES AND METHODS FOR TESTING PROGRAMMABLE LOGIC DEVICES HAVING MIXED-FABRIC ARCHITECTURES

(75) Inventor: Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 115 days.

(21) Appl. No.: 11/136,114

(22) Filed: May 24, 2005

Related U.S. Application Data

(62) Division of application No. 10/295,715, filed on Nov. 15, 2002, now Pat. No. 6,944,836.

(51) Int. Cl.
*H03K 19/173* (2006.01)

(52) U.S. Cl. .................... 326/38; 326/41; 714/725

(58) Field of Classification Search ............ 326/37–41, 326/46; 714/724–726
See application file for complete search history.

(56) References Cited

U.S. PATENT DOCUMENTS

| | | | |
|---|---|---|---|
| 5,361,373 A | 11/1994 | Gilson | |
| 5,537,601 A | 7/1996 | Kimura et al. | |
| 5,652,904 A | 7/1997 | Trimberger | |
| 5,671,355 A | 9/1997 | Collins | |
| 5,752,035 A | 5/1998 | Trimberger | |
| 5,841,867 A | 11/1998 | Jacobson et al. | |
| 5,970,254 A | 10/1999 | Cooke et al. | |
| 6,020,755 A | 2/2000 | Andrews et al. | |
| 6,096,091 A | 8/2000 | Hartmann | |
| 6,279,045 B1 | 8/2001 | Muthujumaraswathy et al. | |
| 6,282,627 B1 | 8/2001 | Wong et al. | |
| 6,343,207 B1 | 1/2002 | Hessel et al. | |
| 6,460,172 B1 | 10/2002 | Insenser Farre et al. | |
| 6,744,274 B1 | 6/2004 | Arnold et al. | |
| 6,817,006 B1 | 11/2004 | Wells et al. | |
| 6,996,758 B1 * | 2/2006 | Herron et al. | 714/726 |
| 2002/0010903 A1 | 1/2002 | Osann, Jr. et al. | |
| 2003/0140255 A1 | 7/2003 | Ricchetti et al. | |
| 2004/0003332 A1 * | 1/2004 | Kim et al. | 714/744 |
| 2005/0081130 A1 | 4/2005 | Rinderknecht et al. | |

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.
Xilinx, Inc.; "Virtex-II Platform FPGA Handbook"; published Dec. 2000, available from Xilinx, Inc., 2100 Logic Drive, San Jose, California 95124; pp. 33-75.

* cited by examiner

*Primary Examiner*—Don Le
(74) *Attorney, Agent, or Firm*—Lois D. Cartier

(57) ABSTRACT

Structures and methods for testing a re-programmable logic block embedded in a one-time programmable fabric in a PLD. The re-programmable logic block is tested without using the one-time programmable resources needed for implementing user circuits, by including a multiple input signature register (MISR) circuit coupled to receive output data from the re-programmable logic portion of the PLD. In some embodiments, a tester operating at a first and lower clock frequency can be used to test a re-programmable logic block operating at a second and higher clock frequency. In some of these embodiments, the one-time programmable fabric is tested at the first clock frequency.

20 Claims, 6 Drawing Sheets

STRUCTURES AND METHODS FOR TESTING PROGRAMMABLE LOGIC DEVICES HAVING MIXED-FABRIC ARCHITECTURES

FIELD OF THE INVENTION

The invention relates to programmable logic devices (PLDS) having mixed-fabric architectures, e.g., PLDS including both one-time programmable and re-programmable logic portions. More particularly, the invention relates to structures and methods for testing the re-programmable logic portions of such mixed-fabric architectures.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

One such FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory, then downloaded to volatile memory as part of an initial configuration sequence.

The functionality of FPGAs and CPLDs is determined by configuration data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell. FPGAs and CPLDs are "re-programmable" PLDS, because the circuits implemented in these devices can be changed by applying new configuration data to the device.

Other PLDs are programmed by applying a processing layer, such as a metal layer, that programmably interconnects the various elements on the device. These PLDs are known as ASIC devices (Application Specific Integrated Circuits). ASICs are "one-time programmable" PLDs, because once the device has been manufactured, the implemented circuit cannot be changed. Other one-time programmable PLDs include, for example, fuse and antifuse devices.

Each type of PLD has its advantages and disadvantages. For example, ASIC devices are relatively inexpensive to manufacture, once the non-recurring engineering (NRE) costs associated with their development are paid. On the other hand, re-programmable PLDs such as FPGAs require more silicon to implement the same functionality, but a user circuit can be quickly implemented in an FPGA and can be as quickly modified if future alterations are necessary.

Therefore, PLD manufacturers are beginning to experiment with mixed-fabric PLD architectures, in which two-different PLD types are included in the same device. For example, Andrews et al., in U.S. Pat. No. 6,020,755 entitled "Hybrid Programmable Gate Arrays", describe an ASIC fabric including embedded FPGA logic cell arrays. Thus, re-programmable logic cells are included in a one-time programmable fabric.

FIG. 1 shows a mixed-fabric PLD in which a re-programmable logic portion 101 is encapsulated by a one-time programmable logic portion 102. An interface area 103 includes connections between the two programmable logic portions 101, 102. Pads 104 are included in the one-time programmable logic portion of the PLD. Therefore, connections between off-chip devices and the re-programmable logic portion 101 are made by programming one-time programmable nets through the one-time programmable logic portion of the PLD.

Testing these mixed-fabric ICs presents new challenges. For example, consider the case of an ASIC fabric (e.g., 102 in FIG. 1) in which an array of FPGA CLBs (e.g., 101 in FIG. 1) is embedded. The CLB array was previously included in a single-fabric FPGA product. Therefore, an extensive test suite already exists that thoroughly tests the functionality of the CLB array. However, in order to properly test the CLB array as part of the mixed-fabric device, it is necessary to monitor the output signals from the CLB array that occur in response to a predetermined sequence of input test data.

When testing a re-programmable device, it is standard practice to configure paths from test points within the device to output pads, where the output signals can be monitored by external test equipment. After the completion of testing, the programming in the device is cleared (e.g., by resetting the device or turning off the power) and the programmable resources used to create the pathways can be reused by the PLD user.

This approach cannot necessarily be used when testing a re-configurable array embedded in a one-time programmable fabric such as an ASIC. Because the output signals from the array are routed through the one-time programmable fabric, any connections to output pads are hard-wired using one-time programmable resources. Thus, these routing resources are no longer available for implementing user circuits. Further, the connections to the output pads are similarly hard-wired, so the output pads also become unavailable for implementing user circuits.

Therefore, it is desirable to provide alternative structures and methods for testing a re-programmable logic block embedded in a one-time programmable fabric in a PLD.

Further, a conventional tester operates at a maximum clock frequency of about 50–200 MHz (megahertz). On the other hand, some available FPGAs can operate at a frequency of about 1 GHz (gigahertz), and FPGA operating frequencies are increasing at a rapid rate. Thus, it is desirable to provide structures and methods for testing re-programmable logic blocks that allow the logic blocks to be tested at a first and higher frequency while using a tester operating at a second and lower frequency.

SUMMARY OF THE INVENTION

The invention provides structures and methods for testing a re-programmable logic block embedded in a one-time programmable fabric in a PLD. The re-programmable logic block is tested without using the one-time programmable resources needed for implementing user circuits, by including a multiple input signature register (MISR) circuit coupled to receive output data from the re-programmable logic portion of the PLD. In some embodiments, a tester operating at a first and lower clock frequency can be used to test a re-programmable logic block operating at a second and higher clock frequency. In some of these embodiments, the one-time programmable fabric is tested at the first clock frequency.

According to a first aspect of the invention, a mixed-fabric PLD includes a one-time programmable logic portion and a re-programmable logic portion coupled together. Also coupled to output terminals of the re-programmable logic portion is an MISR circuit that provides a signature output from the output signals of the re-programmable logic portion. Some embodiments also include a boundary scan chain coupled to receive the signature output from the MISR circuit. Some embodiments include one or more additional MISR circuits coupled to a second group of output terminals of the re-programmable logic portion and providing a second signature output, e.g., to the boundary scan chain.

In some embodiments, the MISR circuit includes a series of alternating XOR and memory elements. Each XOR element is driven by an output terminal of the re-programmable logic portion and by a preceding memory element, and drives a subsequent memory element in the series. An additional XOR element driving the first XOR element is driven by output terminals of selected ones of the memory elements.

In some embodiments, the one-time programmable logic portion of the PLD is one of the following one-time programmable logic fabrics: Application Specific Integrated Circuits (ASICs), fuse devices, and antifuse devices. In some embodiments, the re-programmable logic portion of the PLD is one of the following re-programmable logic fabrics: Field Programmable Gate Arrays (FPGAs), Complex Programmable Logic Devices (CPLDs), Programmable Logic Arrays (PLAs), and Programmable Array Logic (PAL) devices.

Some embodiments include a programmable clock manager circuit. The programmable clock manager circuit has a clock input terminal coupled to a clock output terminal of the one-time programmable logic portion, and a clock output terminal coupled to a clock input terminal of the re-programmable logic portion. The clock output terminal is also coupled to a clock input terminal of the MISR circuit. The programmable clock manager circuit can accept a first clock input signal at a first frequency and provide a second clock input signal at a second frequency (e.g., a higher frequency). Thus, a clock source such as a tester can provide the first clock signal at the first frequency, while the re-programmable logic portion of the PLD can be tested at the second clock frequency using the second clock signal.

According to a second aspect of the invention, a test system includes a tester and a mixed-fabric PLD. The mixed-fabric PLD includes a one-time programmable logic portion having a clock input terminal coupled to the clock output terminal of the tester, a programmable clock manager circuit having a clock input terminal coupled to the clock output terminal of the tester and further having a clock output terminal, a re-programmable logic portion having a clock input terminal coupled to the clock output terminal of the programmable clock manager and a plurality of output terminals, and an MISR circuit having a clock input terminal coupled to the clock output terminal of the clock manager circuit, a plurality of input terminals coupled to the output terminals of the re-programmable logic portion of the PLD, and at least one output terminal coupled to a test data input terminal of the tester.

In some embodiments, the programmable clock manager circuit is programmed to provide from a first clock signal on the clock input terminal a second clock signal on the clock output terminal, and a clock frequency of the second clock signal is higher than the clock frequency of the first clock signal. Thus, the tester operates at a first low frequency, while the re-programmable logic portion of the PLD is tested at a higher clock frequency using the second clock signal.

In some embodiments, the PLD also includes a boundary scan chain coupled between the MISR circuit and the test data input terminal of the tester. In some embodiments, the PLD includes at least one additional MISR circuit coupled between a second group of output terminals of the re-programmable logic portion of the PLD and the test data input terminal of the tester, or between the second group of output terminals of the re-programmable logic portion of the PLD and the boundary scan chain.

According to a third aspect of the invention, a mixed-fabric PLD includes a one-time programmable logic portion, a re-programmable logic portion, a first MISR, and a programmable clock manager circuit coupled together in a fashion similar to those described above. The invention provides a method of testing the mixed-fabric PLD that includes: programming the re-programmable logic portion of the PLD to implement a test circuit; programming the clock manager circuit to receive a first clock signal at a first clock frequency, to provide a second clock signal at a second clock frequency, and to apply the second clock signal to the re-programmable logic portion and to the first MISR circuit; applying a test pattern to the PLD wherein the test pattern is applied at the first clock frequency and the re-programmable logic and the first MISR circuit function at the second clock frequency; and receiving signature data from the first MISR circuit at the first clock frequency, the signature data being derived from output data from the re-programmable logic portion.

In some embodiments, the second clock frequency is higher than the first clock frequency. In some embodiments, the one-time programmable logic functions at the first clock frequency. In some embodiments, the MISR circuit is programmable, and the method includes programming the first MISR circuit to enable an MISR function.

Some embodiments of the invention further include: comparing the received signature data to expected signature data; reporting a passed pattern when the received signature data matches the expected signature data; and reporting a failed pattern when the received signature data does not match the expected signature data.

In some embodiments, the PLD includes at least a second MISR circuit that also functions at the second clock frequency. In these embodiments, the method includes programming the clock manager circuit to apply the second clock signal to the second MISR circuit, and receiving signature data from the second MISR circuit at the first clock frequency.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of mixed-fabric programmable logic devices (PLDs). The present invention has been found to be particularly applicable and beneficial when applied to mixed-fabric PLDs in which a re-programmable logic block is fully embedded in a one-time programmable fabric. While the present invention is not so limited, an appreciation of the present invention is presented by way of specific examples, in this instance with a re-programmable logic area of the PLD being completely encapsulated by an area of one-time programmable logic. However, it will be apparent to one skilled in the art that the present invention can be applied to any mixed-fabric PLD.

Figure 1:
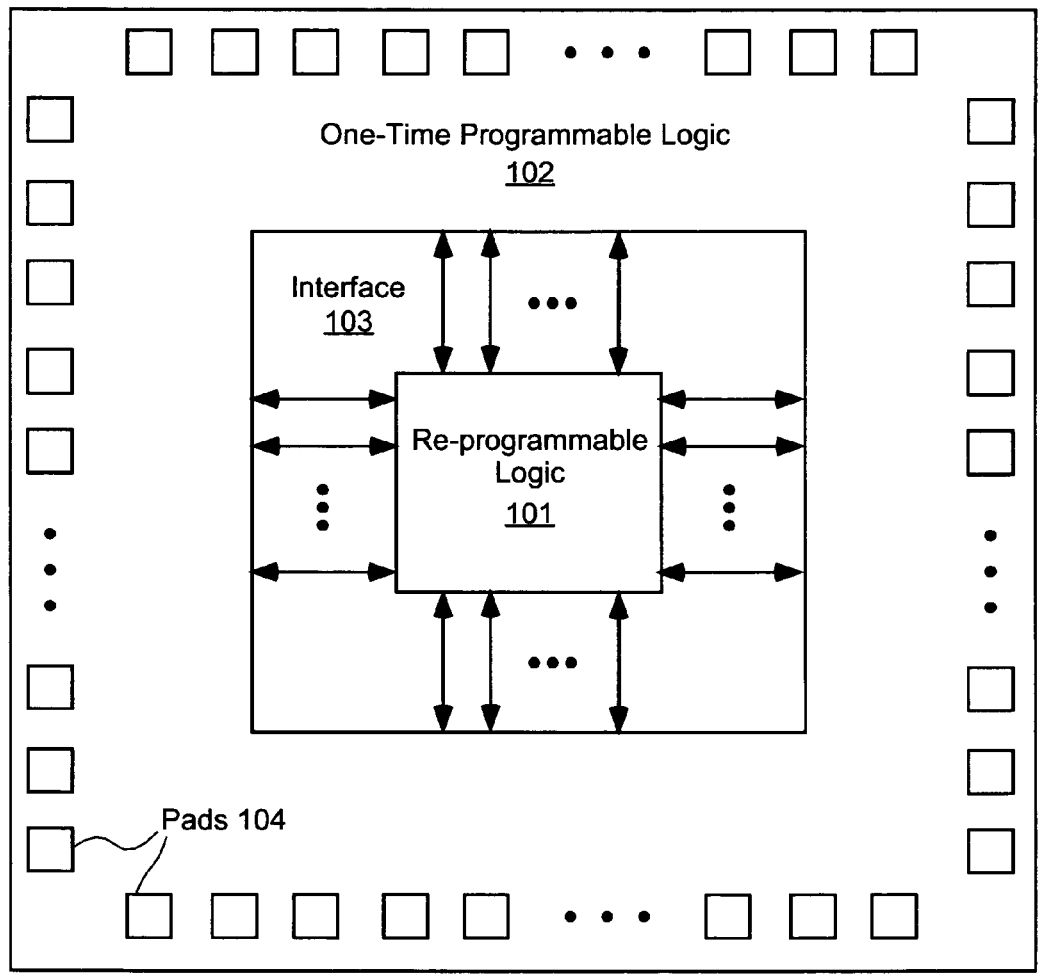
FIG. 1 is a block diagram of a known mixed-fabric PLD including a re-programmable logic portion, a one-time programmable logic portion, and an interface between the two portions.
Figure 2:
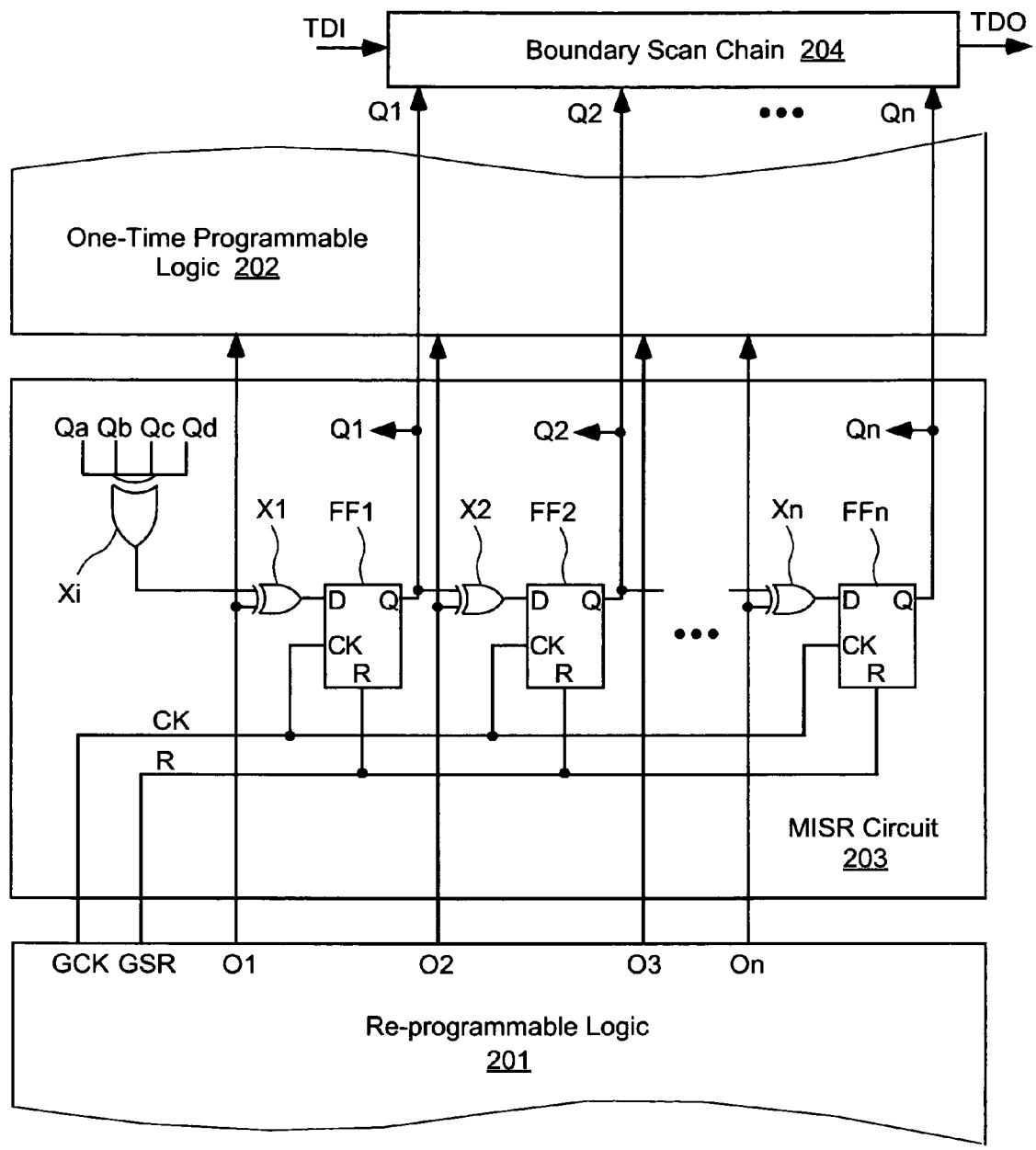
FIG. 2 is a block diagram of a mixed-fabric PLD according to one embodiment of the invention that includes a multiple input signature register (MISR) circuit.

FIG. 2 shows a mixed-fabric PLD according to one embodiment of the invention. The PLD of FIG. 2 includes a re-programmable logic portion 201, a one-time programmable logic portion 202, a multiple input signature register (MISR) circuit 203, and a boundary scan chain 204. MISR circuit 203 monitors output signals O1–On from re-programmable logic portion 201 and provides the resulting signature data to boundary scan chain 204 via signals Q1–Qn. (In the present specification, the same reference characters are used to refer to terminals, signal lines, and their corresponding signals. Also in the present specification, the terms "multiple input signature register" and "MISR" also encompass the special case where the signature register has only one input signal, sometimes referred to as a "single input signature register" or "SISR".)

Boundary scan chain 204 accepts an input signal on the Test Data In (TDI) terminal, incorporates the data provided by MISR circuit 203 on signal lines Q1–Qn, and provides an output signal Test Data Out (TDO). This test data can be monitored, for example, by a tester and compared to expected signature data for re-programmable logic portion 201. The expected signature data can be determined, for example, by advance simulation of the MISR circuit and the test circuit implemented in the re-programmable logic portion of the PLD.

MISR circuits are well-known in the relevant arts, and any MISR implementation can be used. FIG. 2 shows one possible implementation for MISR circuit 203. The illustrated MISR circuit includes a series of memory elements (e.g., flip-flops) FF1–FFn alternating with XOR elements X1–Xn. Each flip-flop FF1–FFn is reset by a reset signal R from re-programmable logic portion 201 (e.g., global set/reset signal GSR in FIG. 2). Each flip-flop FF1–FFn is clocked by a clock signal CK also provided by re-programmable logic portion 201 (e.g., global clock signal GCK in FIG. 2). Thus, the timing of the MISR circuit is the same as the timing of the re-programmable logic portion of the PLD.

Each XOR element X1–Xn is driven by an associated output terminal O1–On of re-programmable logic portion 201 and by the registered output signal Q from a preceding memory element. Each XOR element X1–Xn drives the data input terminal D of a subsequent memory element FF1–FFn in the series. An initial XOR element Xi drives the first XOR element X1 in the series. XOR element Xi is driven by output terminals of selected ones of the memory elements. In some embodiments, XOR element Xi has four input terminals. In other embodiments (not shown), XOR element Xi has other numbers of input terminals.

The value of n (i.e., the number of memory elements in MISR circuit 203) can be, for example, based on the number of output signals available from the re-programmable logic portion 201 of the PLD. The selection of MISR taps (i.e., which memory element outputs are fed back to initial XOR element Xi) can be made, for example, to maximize sensitivity to output errors and to minimize aliasing. In one embodiment, n is 16 and the selected taps are Q3, Q7, Q10, and Q16. In another embodiment, n is 32 and the selected taps are Q7, Q19, Q26, and Q32. In yet another embodiment, n is 48 and the selected taps are Q19, Q29, Q38, and Q48.

Boundary scan chain 204 can conform to any desired boundary scan protocol. For example, boundary scan chain 204 can conform to the LSSD protocol or the IEEE 1149 JTAG protocol. In other embodiments (not shown), boundary scan chain 204 is omitted, and the signature data from MISR circuit 203 is provided to a tester or observer using other circuits or methods.

Figure 3:
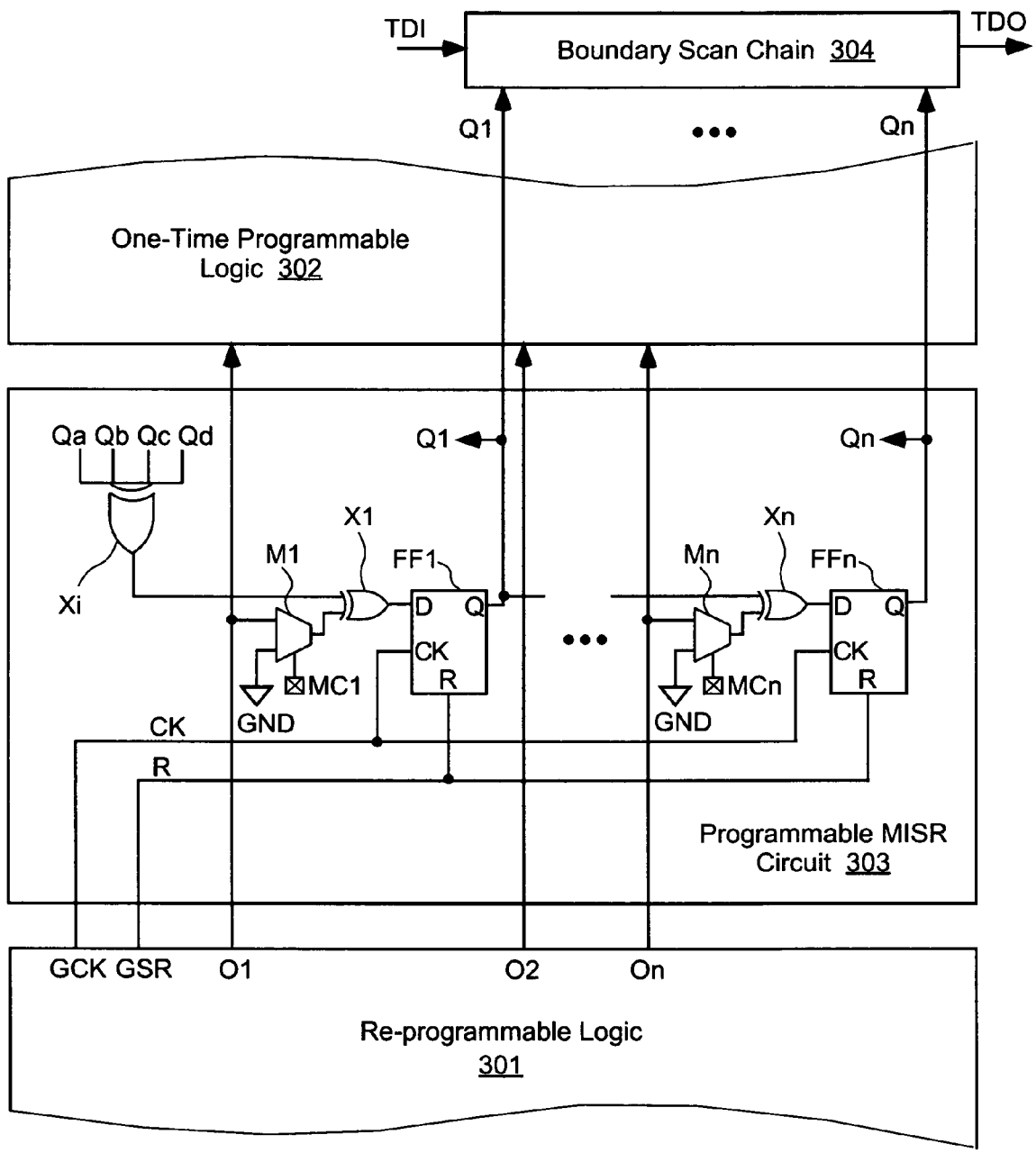
FIG. 3 is a block diagram of a mixed-fabric PLD according to another embodiment of the invention that includes a programmable MISR circuit.

FIG. 3 shows a mixed-fabric PLD according to another embodiment of the invention that includes a programmable MISR circuit. In the illustrated embodiment, MISR circuit 303 includes a multiplexer M1–Mn on the path between each re-programmable logic output signal O1–On and XOR element X1–Xn. Each multiplexer M1–Mn is controlled by a memory cell MC1–MCn. When the associated memory cell stores a first value, each multiplexer M1–Mn passes the re-programmable logic output signal O1–On to the associated XOR element X1–Xn. When the associated memory cell stores a second value, each multiplexer M1–Mn passes the ground signal GND to the associated XOR element X1–Xn, i.e., MISR circuit 303 ignores output signals O1–On. In another embodiment (not shown), a single memory cell controls all of multiplexers M1–Mn.

In one embodiment, where re-programmable logic portion 301 is an array of FPGA logic blocks controlled by SRAM-based configuration memory cells, memory cells MC1–MCn are similar to the SRAM-based memory cells of the FPGA logic block array. In some of these embodiments, memory cells MC1–MCn are programmed using the same configuration data file and the same process used to program the FPGA logic blocks.

In some embodiments (not shown), the clock and/or reset connections between the re-programmable logic portion and the MISR circuit are also programmable, and can be controlled (for example) using similar SRAM memory cells. These memory cells can be programmed using the same configuration data file and the same process used to program the FPGA logic blocks, or can be separately enabled using (for example) a user option in the software that generates the configuration data file.

Figure 4:
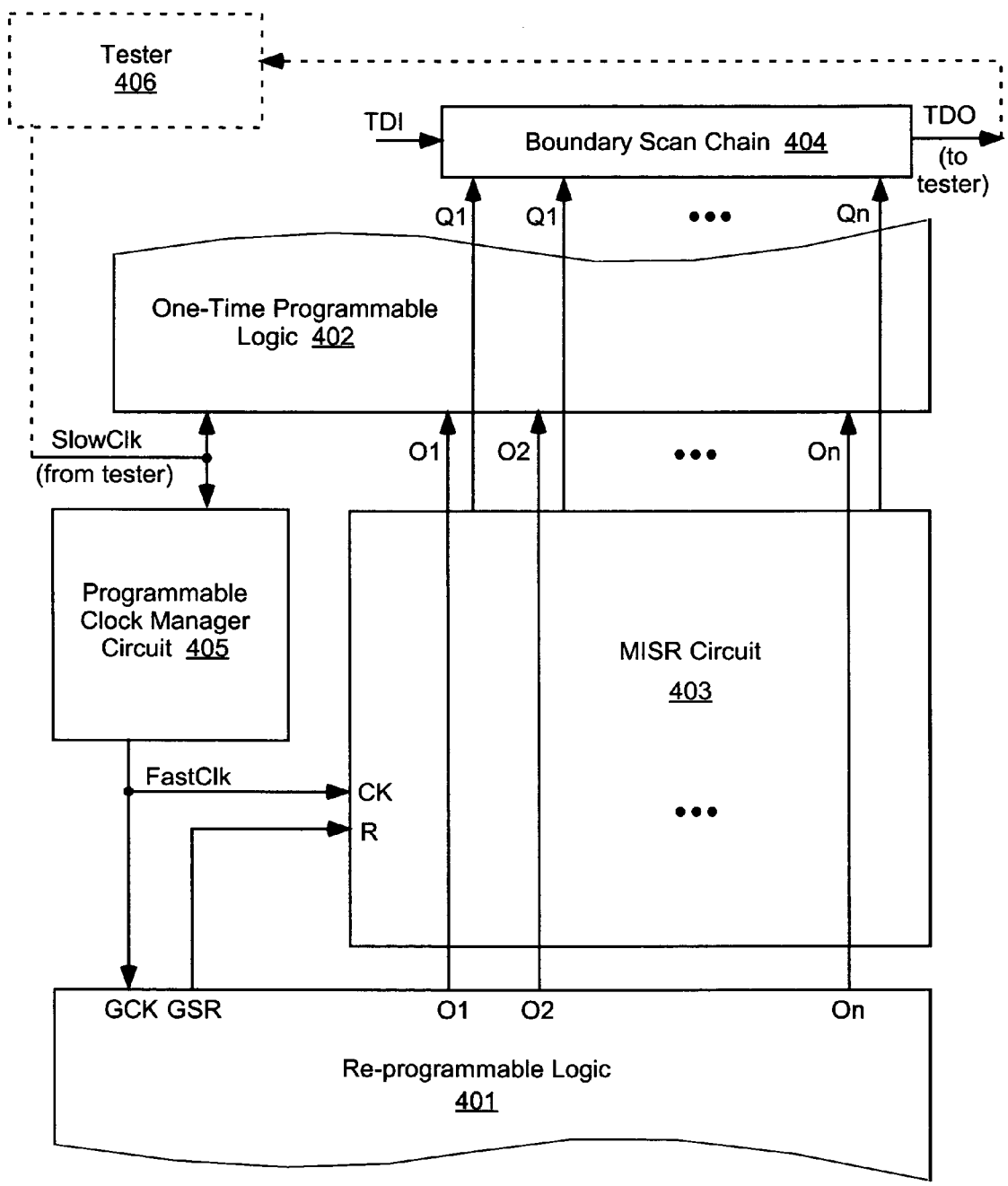
FIG. 4 is a block diagram of a system including a mixed-fabric PLD according to one embodiment of the invention, the mixed-fabric PLD including a programmable clock manager circuit and an MISR circuit.

FIG. 4 shows a system including a mixed-fabric PLD according to one embodiment of the invention, the mixed-fabric PLD including a programmable clock manager circuit and an MISR circuit. In addition to the mixed-fabric PLD, the system of FIG. 4 includes a tester 406 coupled to receive the test data output signal TDO from the PLD and to provide a first clock signal (SlowClk) to the PLD. In some embodiments, the tester also provides test input data (not shown) to other pins of the PLD, and receives other test output data (not shown) from other pins of the PLD.

In addition to the elements shown in FIGS. 2 and 3, the mixed-fabric PLD of FIG. 4 includes a programmable clock manager circuit 405. For example, in one embodiment where the re-programmable logic portion 401 of the PLD is an array of FPGA logic blocks such as those included in the Xilinx Virtex-II devices, programmable clock manager circuit 405 is the "Digital Clock Manager" circuit also included in the Virtex-II FPGA.

Programmable clock manager circuit 405 receives the first clock signal SlowClk from tester 406. In some embodiments, the first clock signal SlowClk is also provided to the one-time programmable logic portion 402 of the PLD. Programmable clock manager circuit 405 is programmed to provide from the first clock signal SlowClk a second clock signal FastClk. In some embodiments, clock signal FastClk has a higher frequency than clock signal SlowClk. However, in other embodiments, clock signal FastClk has a lower frequency than clock signal SlowClk. Clock signal FastClk is provided by programmable clock manager circuit 405 to the re-programmable logic portion 401 of the PLD and to MISR circuit 403.

Thus, while the tester operates at a first clock frequency associated with the first clock signal SlowClk, the re-programmable logic portion 401 and the MISR circuit 403 operate at a second clock frequency associated with the second clock signal FastClk. Hence, while tester 406 operates at a first clock frequency (e.g., a lower clock frequency), the re-programmable logic portion 401 of the PLD can be tested using MISR circuit 403 at a second clock frequency (e.g., a higher clock frequency).

As described above in the section entitled "Background of the Invention", a conventional tester operates at a maximum clock frequency of about 50–200 MHz. However, a re-programmable logic portion of a PLD that includes FPGA logic blocks can operate, for example, at a frequency of about 1 GHz. Using the system shown in FIG. 4, the re-programmable logic portion of the PLD can be tested at about 1 GHz using a tester that operates at only 50–200 MHz.

Figure 5:
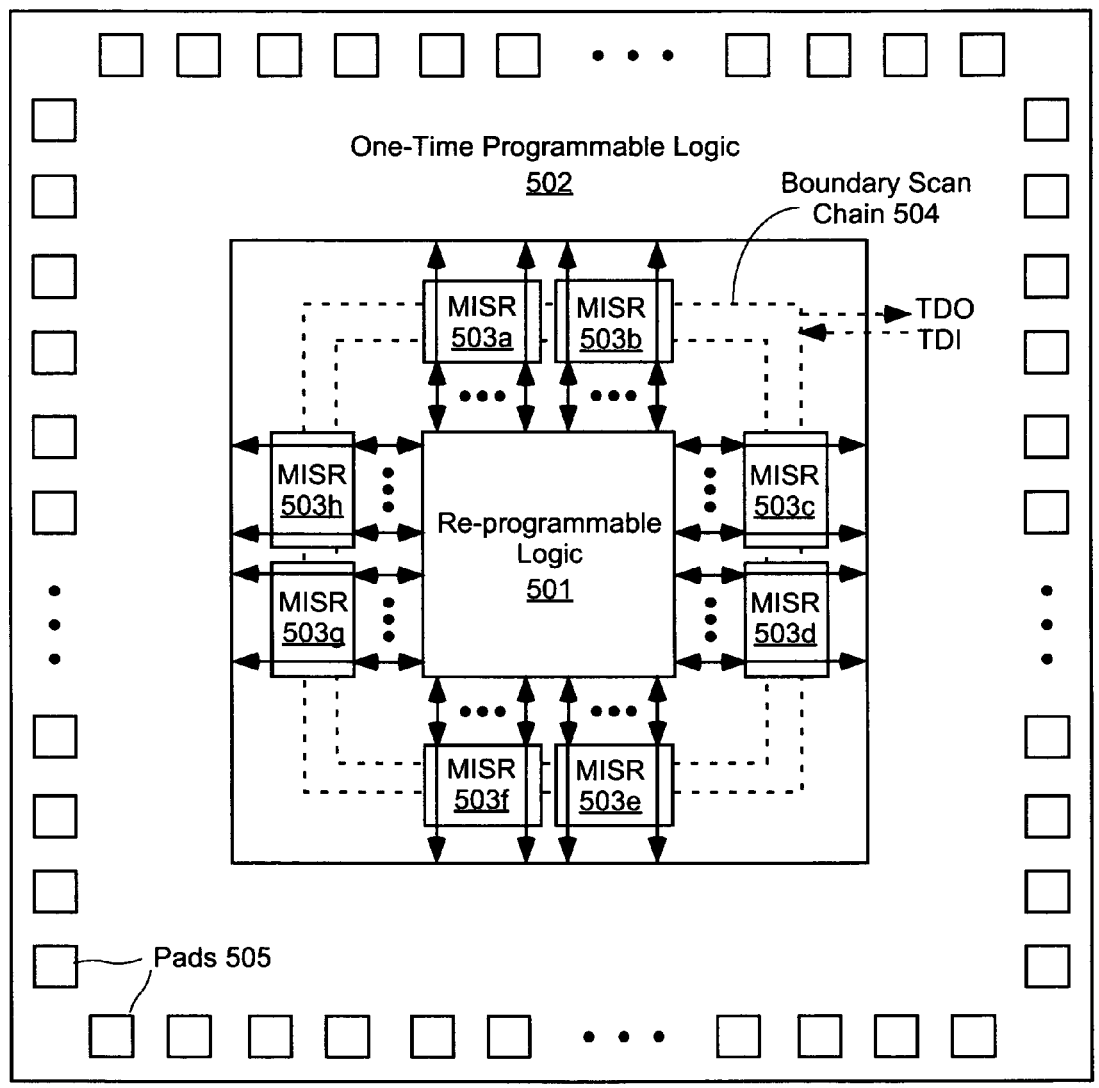
FIG. 5 is a block diagram of a mixed-fabric PLD according to one embodiment of the invention that includes a plurality of MISR circuits.

FIG. 5 shows a mixed-fabric PLD according to another embodiment of the invention that includes a plurality of MISR circuits. In this embodiment, re-programmable logic portion 501 of the mixed-fabric PLD constitutes an array of Virtex-II FPGA logic blocks, and one-time programmable logic portion 502 is an ASIC fabric. Each half-edge of re-programmable logic portion 501 has an associated MISR circuit 503*a*–503*h*. Each MISR circuit 503*a*–503*h* contributes its signature data output to a boundary scan chain 504, which in turn contributes via terminals TDI and TDO to the boundary scan chain for the complete PLD.

Figure 6:
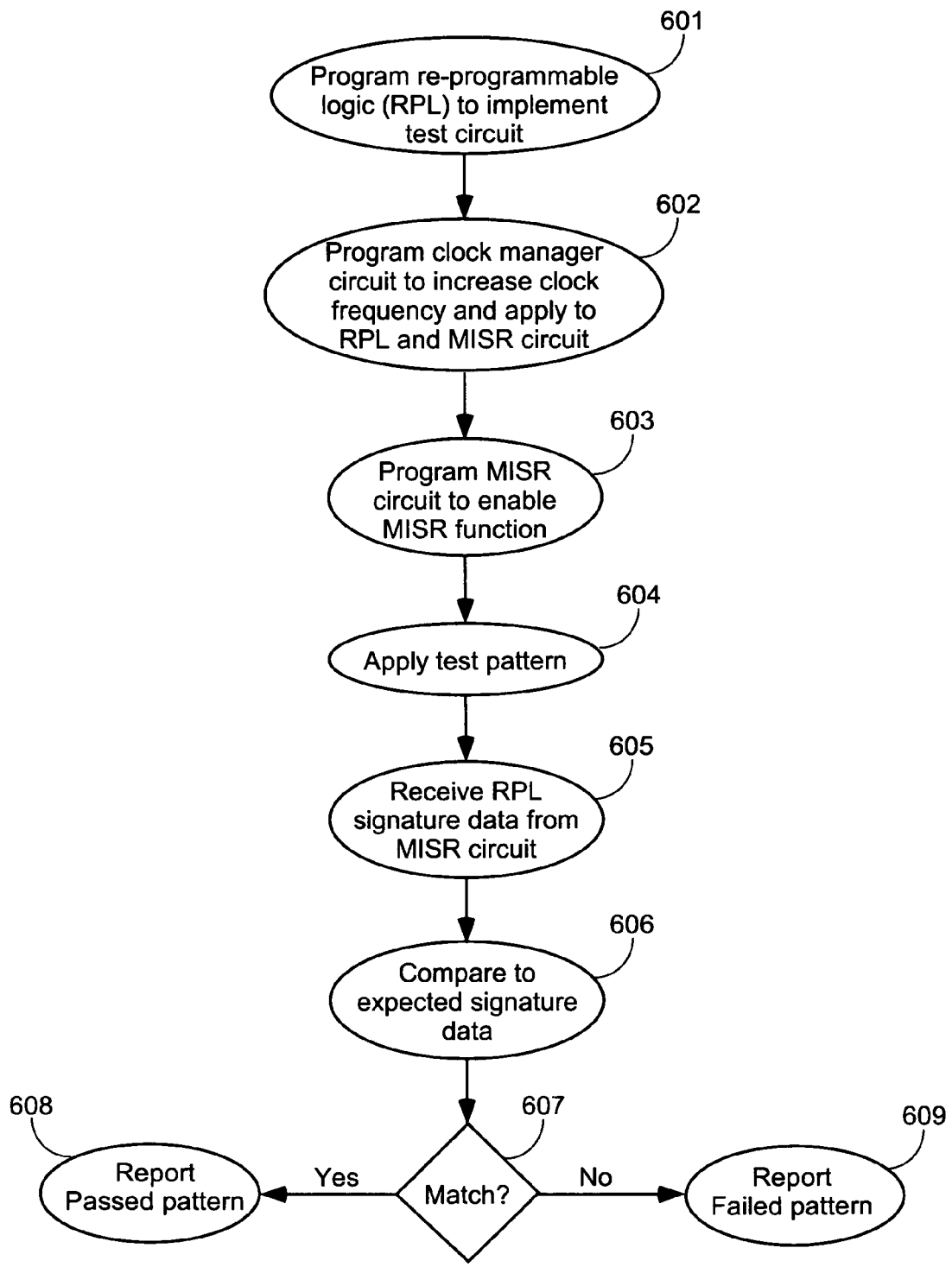
FIG. 6 illustrates a process for testing a mixed-fabric PLD according to another aspect of the invention.

FIG. 6 illustrates a process for testing a mixed-fabric PLD according to another aspect of the invention. The mixed-fabric PLD includes a one-time programmable logic portion, a re-programmable logic portion, a first MISR circuit, and a programmable clock manager circuit. For example, the steps of this process can be carried out using the system shown in FIG. 4.

In step 601, the re-programmable logic portion of the mixed-fabric PLD is programmed to implement a test circuit. The test circuit can, for example, be similar or identical to a test circuit used to test a re-programmable logic device that is not included in a mixed-fabric PLD. As a separate step 602 or as part of the same configuration process, the clock manager circuit is programmed to provide a second clock signal from a first clock signal. For example, a first, slower clock signal can be provided by a tester, and the clock manager circuit can be programmed to provide a higher-frequency second clock signal from the first clock signal. The clock manager circuit is also programmed to provide the second clock signal to the re-programmable logic portion of the PLD and to the MISR circuit.

In optional step 603, the MISR circuit is programmed to enable the MISR function. For example, when the MISR circuit shown in FIG. 3 is used, memory cells MC1–MCn can be programmed at the same time as re-programmable logic portion 301. However, when the MISR circuit shown in FIG. 2 is used, this step is omitted.

In step 604, a test pattern is applied to the mixed-fabric PLD that exercises the test circuit programmed into the re-programmable logic portion of the PLD. The MISR circuit captures the output data from the test circuit and generates signature data. In step 605, the signature data is received from the MISR circuit, e.g., by a tester coupled to the PLD. In step 606, the signature data is compared to expected signature data. When the data matches (step 607), the tester reports a passed test pattern (step 608). When the data does not match (step 607), the tester reports a failed test pattern (step 609).

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, an MISR circuit can be implemented using other taps than those described herein, and logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A mixed-fabric programmable logic device (PLD), comprising:
   a one-time programmable logic portion;
   a re-programmable logic portion at least partially embedded in the one-time programmable logic portion and coupled thereto, the re-programmable logic portion having a plurality of output terminals; and
   a first multiple input signature register (MISR) circuit having input terminals coupled to the output terminals of the re-programmable logic portion and further having a plurality of signature output terminals.

2. The mixed-fabric PLD of claim 1, further comprising a boundary scan chain having input terminals coupled to the signature output terminals of the first MISR circuit.

3. The mixed-fabric PLD of claim 1, further comprising a programmable clock manager circuit having a clock input terminal coupled to a clock output terminal of the one-time programmable logic portion and a clock output terminal coupled to a clock input terminal of the re-programmable logic portion and further coupled to a clock input terminal of the first MISR circuit.

4. The mixed-fabric PLD of claim 3, wherein:
   the programmable clock manager circuit is programmed to provide from a first clock signal on the clock input terminal a second clock signal on the clock output terminal; and
   a clock frequency of the second clock signal is higher than a clock frequency of the first clock signal.

5. The mixed-fabric PLD of claim 1, wherein the one-time programmable logic portion comprises one of a group of one-time programmable logic fabrics consisting of: Application Specific Integrated Circuits (ASICs), fuse devices, and antifuse devices.

6. The mixed-fabric PLD of claim 1, wherein the re-programmable logic portion comprises one of a group of re-programmable logic fabrics consisting of: Field Programmable Gate Arrays (FPGAs), Complex Programmable Logic Devices (PLDs), Programmable Logic Arrays (PLAs), and Programmable Array Logic (PAL) devices.

7. The mixed-fabric PLD of claim 1, further comprising a second MISR circuit having input terminals coupled to a second group of output terminals of the re-programmable logic portion and further having a plurality of signature output terminals.

8. The mixed-fabric PLD of claim 7, further comprising a boundary scan chain having input terminals coupled to the signature output terminals of the first MISR circuit and further coupled to the signature output terminals of the second MISR circuit.

9. The mixed-fabric PLD of claim 1, wherein the first MISR circuit comprises:
   a plurality of first XOR elements, each of the first XOR elements having a first input terminal coupled to one of the output terminals of the re-programmable logic portion, a second input terminal, and an output terminal;
   a plurality of memory elements coupled in an alternating series with the first XOR elements, a data input terminal of each memory element being coupled to the output terminal of one of the XOR elements and a data output terminal of each memory element being coupled to the second input terminal of one of the first XOR elements and further coupled to one of the signature output terminals of the first MISR circuit; and
   a second XOR element having a plurality of input terminals coupled to the data output terminals of selected ones of the memory elements and further having an output terminal coupled to the second input terminal of a first one of the first XOR elements.

10. The mixed-fabric PLD of claim 9, wherein a set of conditions applies, the set of conditions consisting of one of the following sets of conditions:
    the plurality of memory elements comprises 16 memory elements and the selected ones of the memory elements comprise third, seventh, tenth, and sixteenth memory elements in the series;
    the plurality of memory elements comprises 32 memory elements and the selected ones of the memory elements comprise seventh, nineteenth, twenty-sixth, and thirty-second memory elements in the series; and
    the plurality of memory elements comprises 48 memory elements and the selected ones of the memory elements comprise nineteenth, twenty-ninth, thirty-eighth, and forty-eighth memory elements in the series.

11. The mixed-fabric PLD of claim 1, wherein the first MISR circuit further comprises a reset input terminal coupled to a reset output terminal of the re-programmable logic portion.

12. A test system, comprising:
    a tester having a clock output terminal and a test data input terminal; and
    a mixed-fabric PLD comprising:
      a one-time programmable logic portion having a clock input terminal coupled to the clock output terminal of the tester;
      a programmable clock manager circuit having a clock input terminal coupled to the clock output terminal of the tester and further having a clock output terminal;
      a re-programmable logic portion having a clock input terminal coupled to the clock output terminal of the programmable clock manager circuit and further having a plurality of output terminals; and
      a first multiple input signature register (MISR) circuit having a clock input terminal coupled to the clock output terminal of the programmable clock manager circuit, a plurality of input terminals coupled to the output terminals of the re-programmable logic portion, and at least one output terminal coupled to the test data input terminal of the tester.

13. The test system of claim 12, wherein:
    the programmable clock manager circuit is programmed to provide from a first clock signal on the clock input terminal a second clock signal on the clock output terminal; and
    a clock frequency of the second clock signal is higher than the clock frequency of the first clock signal.

14. The test system of claim 12, wherein the one-time programmable logic portion of the mixed-fabric PLD comprises one of a group of one-time programmable logic fabrics consisting of:
    Application Specific Integrated Circuits (ASICs), fuse devices, and antifuse devices.

15. The test system of claim 12, wherein the one-time programmable logic portion of the mixed-fabric PLD comprises one of a group of re-programmable logic fabrics consisting of: Field Programmable Gate Arrays (FPGAs), Complex Programmable Logic Devices (PLDs), Programmable Logic Arrays (PLAs), and Programmable Array Logic (PAL) devices.

16. The test system of claim 12, wherein the mixed-fabric PLD further comprises a boundary scan chain coupled between the at least one output terminal of the MISR circuit and the test data input terminal of the tester.

17. The test system of claim 12, wherein the mixed-fabric PLD further comprises a second MISR circuit coupled between a second group of output terminals of the re-programmable logic portion of the PLD and the test data input terminal of the tester.

18. The test system of claim 17, wherein the mixed-fabric PLD further comprises a boundary scan chain coupled between the first MISR circuit and the test data input terminal of the tester and further coupled between the second MISR circuit and the test data input terminal of the tester.

19. The test system of claim 12, wherein the first MISR circuit comprises:
- a plurality of signature output terminals;
- a plurality of first XOR elements, each of the first XOR elements having a first input terminal coupled to one of the output terminals of the re-programmable logic portion, a second input terminal, and an output terminal;
- a plurality of memory elements coupled in an alternating series with the first XOR elements, a data input terminal of each memory element being coupled to the output terminal of one of the XOR elements and a data output terminal of each memory element being coupled to the second input terminal of one of the first XOR elements and further coupled to one of the signature output terminals of the first MISR circuit; and
- a second XOR element having a plurality of input terminals coupled to the data output terminals of selected ones of the memory elements and further having an output terminal coupled to the second input terminal of a first one of the first XOR elements.

20. The test system of claim 19, wherein the first MISR satisfies one of a set of conditions, the set of conditions consisting of one of the following sets of conditions:
- the plurality of memory elements comprises 16 memory elements and the selected ones of the memory elements comprise third, seventh, tenth, and sixteenth memory elements in the series;
- the plurality of memory elements comprises 32 memory elements and the selected ones of the memory elements comprise seventh, nineteenth, twenty-sixth, and thirty-second memory elements in the series; and
- the plurality of memory elements comprises 48 memory elements and the selected ones of the memory elements comprise nineteenth, twenty-ninth, thirty-eighth, and forty-eighth memory elements in the series.

* * * * *